United States Patent
Schillgalies et al.

(10) Patent No.: US 8,625,648 B2
(45) Date of Patent: Jan. 7, 2014

(54) EDGE-EMITTING SEMICONDUCTOR LASER

(75) Inventors: Marc Schillgalies, Berlin (DE); Teresa Lermer, Regensburg (DE); Christoph Eichler, Tegernheim (DE)

(73) Assignee: OSRAM Opto Semiconductors GmbH, Regensburg (DE)

(*) Notice: Subject to any disclaimer, the term of this patent is extended or adjusted under 35 U.S.C. 154(b) by 0 days.

(21) Appl. No.: 13/393,167

(22) PCT Filed: Aug. 19, 2010

(86) PCT No.: PCT/EP2010/062136
§ 371 (c)(1),
(2), (4) Date: Apr. 23, 2012

(87) PCT Pub. No.: WO2011/023625
PCT Pub. Date: Mar. 3, 2011

(65) Prior Publication Data
US 2012/0201262 A1    Aug. 9, 2012

(30) Foreign Application Priority Data
Aug. 28, 2009 (DE) .......................... 10 2009 039 248

(51) Int. Cl.
*H01S 5/00* (2006.01)
(52) U.S. Cl.
USPC .................................... 372/45.01; 372/44.01
(58) Field of Classification Search
USPC ........................................... 372/45.01, 44.01
See application file for complete search history.

(56) References Cited

U.S. PATENT DOCUMENTS

| 2001/0030317 | A1 | 10/2001 | Lee et al. | |
| 2004/0028104 | A1 | 2/2004 | Buda et al. | |
| 2005/0201439 | A1 | 9/2005 | Horie | |
| 2007/0002914 | A1* | 1/2007 | Ryu et al. | 372/45.01 |
| 2008/0137701 | A1 | 6/2008 | Freund | |

FOREIGN PATENT DOCUMENTS

| JP | 5 243669 | 9/1993 |
| JP | 2008-053760 | 3/2008 |
| WO | WO 2005/074081 | 8/2005 |

OTHER PUBLICATIONS

Schillgalies M., "MOVPE von InGan-basierten Halbleiterlasern im Wellenlängenbereich von 400 nm bis 450 nm", Hochschulschrift Leipzig. Univ., Diss., 2008, pp. 33-41.

* cited by examiner

*Primary Examiner* — Kinam Park
(74) *Attorney, Agent, or Firm* — Cozen O'Connor

(57) ABSTRACT

An edge emitting semiconductor laser (1) is specified, comprising an n-side waveguide region (21) and a p-side waveguide region (22); an active zone (20) for generating electromagnetic radiation; at least one reflection layer (24) in the n-side waveguide region (21), wherein the active zone (20) is arranged between the two waveguide regions (21, 22), the thickness of the n-side waveguide region (21) is greater than that of the p-side waveguide region (22), the refractive index of the reflection layer (24) is less than the refractive index of the n-side waveguide region (21) adjoining the reflection layer (24).

11 Claims, 8 Drawing Sheets

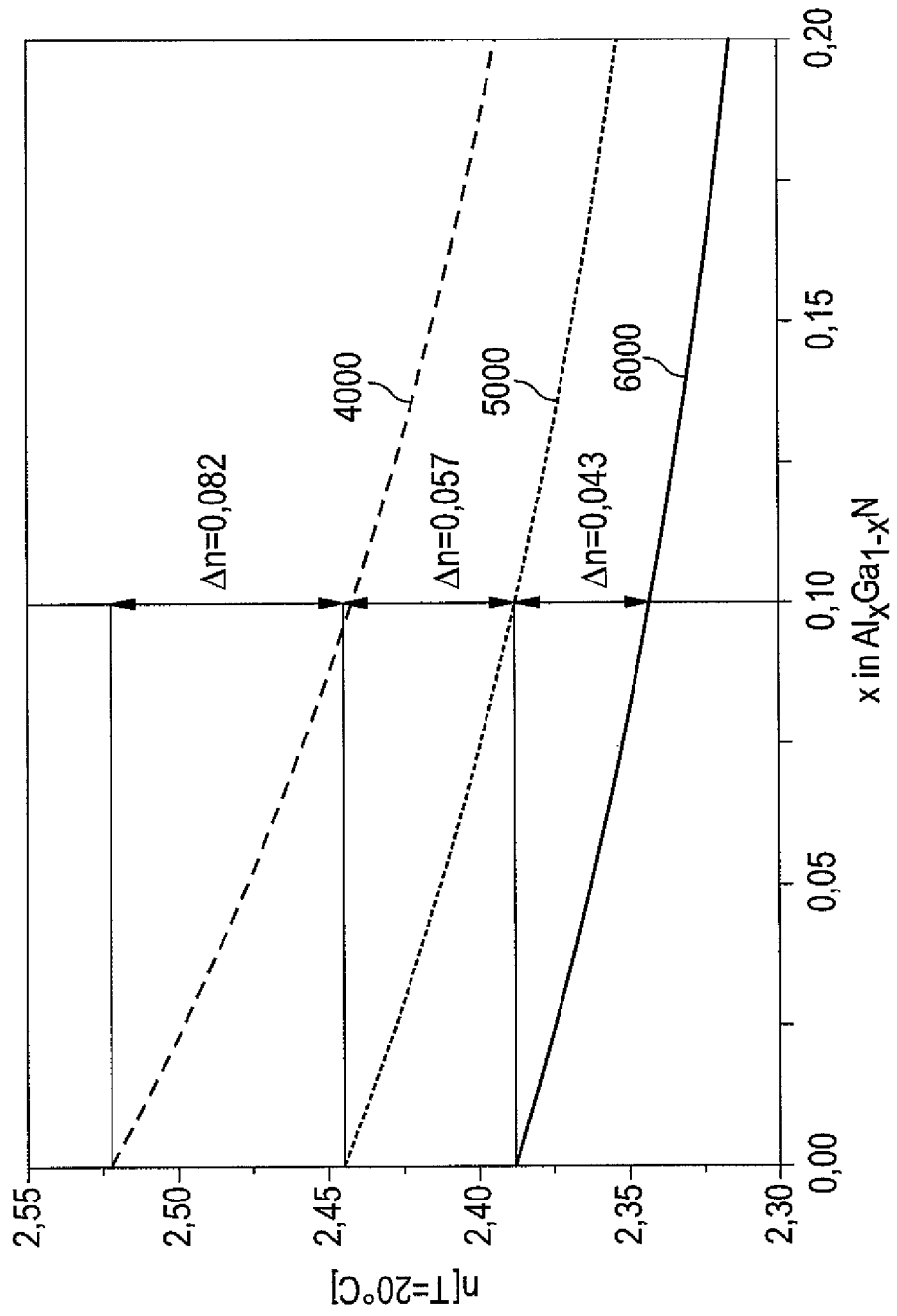

EDGE-EMITTING SEMICONDUCTOR LASER

RELATED APPLICATION

This application is a U.S. National Phase Application under 35 USC 371 of International Application PCT/EP2010/062136 filed Aug. 19, 2010.

This application claims the priority of Germany application no. 10 2009 039 248.3 filed Aug. 28, 2009, the entire content of which is hereby incorporated by reference.

FIELD OF THE INVENTION

An edge emitting semiconductor laser is specified.

SUMMARY OF THE INVENTION

One object of the invention is to provide an edge emitting semiconductor laser which is suitable for high optical output powers.

In accordance with at least one embodiment of the edge emitting semiconductor laser, the latter comprises an n-side waveguide region and a p-side waveguide region. By way of example, the semiconductor laser is formed with a semiconductor body, which is grown epitaxially. N- and p-side waveguide regions can then be formed in places by semiconductor layer sequences of the semiconductor body. In this connection, "p- and n-side" means that the semiconductor body has regions which are embodied as "n- or p-conducting" with regard to their electrical conductivity. N- and p-side waveguide regions are suitable for guiding electromagnetic radiation.

In accordance with at least one embodiment, the edge emitting semiconductor laser comprises an active zone for generating electromagnetic radiation. The active zone can be a layer which emits radiation in the wavelength range from ultraviolet to infrared light of the spectrum of the electromagnetic radiation. Preferably, the active zone emits radiation from the ultraviolet to green spectral range of the electromagnetic radiation. The active zone preferably comprises a pn-junction, a double heterostructure, a single quantum well (SQW) or a multi quantum well (MQW) structure for generating radiation.

In accordance with at least one embodiment of the edge emitting semiconductor laser, the active zone is arranged between the two waveguide regions. Preferably, the active zone in each case directly adjoins the waveguide regions with two opposite outer surfaces, such that the two waveguide regions are opposite one another and are separated by the active zone. The p-side waveguide region is bounded by the p-side of the active zone and the n-side waveguide region is bounded by the n-side of the active zone. The active zone then forms together with the two waveguide regions an overall waveguide region.

In accordance with at least one embodiment of the edge emitting semiconductor laser, the thickness of the n-side waveguide region is greater than that of the p-side waveguide region. In this connection, "thickness" means the direction perpendicular to the epitaxially grown semiconductor layer sequence of the waveguide regions. In other words, the overall waveguide region of the semiconductor laser is constructed asymmetrically by virtue of the different thicknesses of p- and n-side waveguide regions. If electromagnetic radiation is emitted by the active zone, then the greater thickness of the n-side waveguide region has the effect that the electromagnetic radiation is guided more within the n-side waveguide region than the p-side waveguide region. What is advantageously made possible by such an asymmetrical embodiment of the waveguide region and an asymmetrical wave guiding associated therewith is that an absorption of electromagnetic radiation emitted by the active zone by the semiconductor material of the semiconductor laser is reduced. Furthermore, although an overlap of the optical wave with the quantum films of the semiconductor material (also confinement factor) is reduced by an overall waveguide embodied in this way, this effect is compensated for on account of the lower absorption of the electromagnetic radiation by semiconductor layers situated, in particular, in the p-side waveguide region.

In accordance with at least one embodiment, the edge emitting semiconductor laser has at least one reflection layer in the n-side waveguide region. Preferably, the reflection layer is integrated in the form of a layer or layer sequence into the n-side waveguide region and thus enclosed in places at outer surfaces by the remaining semiconductor material of the n-side waveguide region.

In accordance with at least one embodiment of the edge emitting semiconductor laser, the refractive index of the reflection layer is less than the refractive index of the n-side waveguide region adjoining the reflection layer.

In accordance with at least one embodiment of the edge emitting semiconductor laser, the latter comprises an n-side waveguide region and a p-side waveguide region, an active zone for generating electromagnetic radiation, and also at least one reflection layer in the n-side waveguide region. Furthermore, the active zone is arranged between the two waveguide regions and the thickness of the n-side waveguide region is greater than that of the p-side waveguide region. Furthermore, the refractive index of the reflection layer is less than the refractive index of the n-side waveguide region adjoining the reflection layer.

In this case, the edge emitting semiconductor laser described here is based on the insight, inter alia, that a stable monomode emission of the electromagnetic radiation of an edge emitting semiconductor laser is achieved by means of a smallest possible emission area in the region of an active zone of the edge emitting semiconductor laser. However, the small emission area of the semiconductor laser leads to a local heating in the region of the semiconductor material/air interface, in particular in the region of the active zone. This local heating on account of absorption or reabsorption of the electromagnetic radiation by the semiconductor material of the edge emitting semiconductor laser can lead to the melting of the affected semiconductor regions and destroy the semiconductor laser in the process. In general, this is then called catastrophical optical damage (also COD).

Furthermore, small emission areas of semiconductor lasers lead to low optical output powers. In addition, such semiconductor lasers can be processed only with difficulty in terms of their production.

On the other hand, edge emitting semiconductor lasers having a large emission area, in the case of which lasers the disturbing catastrophical optical damage is less likely, have the disadvantage that the beam quality is impaired on account of additional optical modes. In other words, the electromagnetic radiation emitted by such semiconductor lasers additionally has higher modes alongside the fundamental mode.

In order, then, firstly to make the risk of catastrophical optical damage less likely and secondly to increase the beam quality, the edge emitting semiconductor laser described here makes use of the concept, inter alia, of introducing at least one reflection layer in an n-side waveguide region of the semiconductor laser, wherein the refractive index of the reflection layer is less than the refractive index of the n-side waveguide region adjoining the reflection layer. By virtue of the lower refractive index of the reflection layer, in the n-side waveguide region an interface is produced at which the electromagnetic radiation emitted by an active zone of the semiconductor laser is at least partly subjected to total reflection. Advantageously, the higher modes of the electromagnetic radiation are not supported on account of the difference in refractive index of the reflection layer and the associated mode-selective (total) reflections at the reflection layer. This leads to an increase in a threshold current of the higher modes, while at the same time a threshold current of the fundamental mode remains constant. In other words, during operation of the edge emitting semiconductor laser, in the case of external current feed, the fundamental mode is already excited whereas, on account of the reflection layer, the higher modes are not yet excited by the externally applied current feed. Advantageously, such a reflection layer enables an edge emitting semiconductor laser having a as high as possible beam quality, that is to say a as high as possible fundamental mode proportion of the electromagnetic radiation emitted by the edge emitting semiconductor laser. At the same time, on account of the beam quality of the edge emitting semiconductor laser that is uniformly high even in the case of large emission areas, high-energy semiconductor lasers are possible which, by way of example, find application in the field of data storage in projection applications or printing technology.

As an alternative or in addition, the object formulated here can also be achieved by means of an edge emitting semiconductor laser wherein the reflection layer described here is dispensed with and, instead, the p-side waveguide region has an undoped spacer layer.

In accordance with at least one embodiment of the edge emitting semiconductor laser, the semiconductor laser comprises an electron blocking layer in the p-side waveguide region. If electrical contact is made with the semiconductor laser externally, then the electron blocking layer prevents electrons from passing from the n-side contact of the semiconductor laser through the active zone into the p-side waveguide region or into the region of p-side contact of the semiconductor laser. The electron blocking layer thus prevents an electron flow between the contacts of the semiconductor laser, as a result of which, by way of example, a short circuit or additional leakage currents in the semiconductor laser are avoided. By means of the electron blocking layer, not only the lifetime of the semiconductor laser but likewise the optical output power thereof can be increased.

In accordance with at least one embodiment, the edge emitting semiconductor laser comprises an undoped spacer layer in the p-side waveguide region, wherein the undoped spacer layer is arranged between the active zone and the electron blocking layer. In other words, the undoped spacer layer spaces apart the active zone and the electron blocking layer from one another. In this connection, "undoped" means that the spacer layer preferably has a dopant concentration of less than $5 \times 10^{17}$ 1/ccm. As a result of the asymmetrical waveguiding, an optical mode, for example the fundamental mode, is guided to a greater extent in the less absorbent n-side waveguide region, as a result of which the internal absorption of the electromagnetic radiation emitted by the active zone within the overall waveguide is reduced. This effect is advantageously further intensified by the undoped spacer layer in the p-side waveguide region. Advantageously, the optical output power of the edge emitting semiconductor laser is improved by means of the undoped spacer layer.

In accordance with at least one embodiment of the edge emitting semiconductor laser, the p-side waveguide region has an electron blocking layer and also an undoped spacer layer, wherein the spacer layer is arranged between the active zone and the electron blocking layer.

If the edge emitting semiconductor laser in at least one embodiment has at least the reflection layer described here and also the undoped spacer layer described here, then the abovementioned physical effects, for example with regard to beam quality and output power, add up and support one another mutually.

In accordance with at least one embodiment, the n-side waveguide region is at least 1.5 times thicker than the p-side waveguide region. It has been found that such a ratio of the thicknesses of the individual waveguide regions has the greatest effect with regard to the reduction of the internal absorption of the electromagnetic radiation within the overall waveguide region.

In accordance with at least one embodiment, the semiconductor material of the reflection layer is based on AlGaN and the semiconductor material of the n-side waveguide region adjoining the reflection layer is based on InGaN. By way of example, the reflection layer has an aluminium concentration of 1.5 to 15%, preferably of between 5 and 9%. By means of the aluminium contained in the reflection layer, the refractive index jump at the interface between the reflection layer and the n-side waveguide region adjoining the reflection layer can advantageously be set individually.

In accordance with at least one embodiment of the edge emitting semiconductor laser, the refractive index of the reflection layer in a wavelength range of 405 nm to 520 nm of the electromagnetic radiation generated by the active zone differs by at least 0.02 from the refractive index of the n-side waveguide region adjoining the reflection layer. Such a difference in refractive index has proved to be especially advantageous with regard to the suppression of the higher radiation modes.

In accordance with at least one embodiment, the reflection layer has a thickness of 15 nm to 150 nm and an aluminium concentration of 1.5% to 15%. Such a thickness at the aluminium concentration mentioned increases the mode stability and also a suppression of the higher modes particularly effectively.

In accordance with at least one embodiment of the edge emitting semiconductor laser, the undoped spacer layer has a thickness of 50 nm to 250 nm. Such a thickness of the undoped spacer layer has also proved to be especially advantageous with regard to the effects mentioned.

In accordance with at least one embodiment, the active zone emits electromagnetic radiation in the range of 390 nm to 560 nm, the n-side waveguide region has a thickness of 150 nm to 750 nm, the reflection layer has a thickness of 15 nm to 150 nm and also an aluminium concentration of 1.5% to 15%, the p-side waveguide region has a thickness of 100 nm to 400 nm, and the undoped spacer layer has a thickness of 50 nm to 250 nm, wherein the n-side waveguide region, the p-side waveguide region and the undoped spacer layer in each case have an indium concentration of at most 10%, preferably of at most 3%, for example of at least 0.2%.

The indications with regard to wavelength, thickness and concentration as mentioned in the case of such an embodiment of the edge emitting semiconductor laser described here have proved to be advantageous for the physical effects and advantages already mentioned above, for example with regard to beam quality and lifetime of the semiconductor laser.

BRIEF DESCRIPTION OF THE DRAWINGS

FIGS. 1B, 2, 3A, 3B, 4, 6A, 6B, 7A to 7C, 8A to 8D, 9A to 9C and 10 show graphical plots for elucidating semiconductor lasers and exemplary embodiments of an edge emitting semiconductor laser described here.

DETAILED DESCRIPTION OF THE DRAWINGS

In the exemplary embodiments and the figures, identical or identically acting constituent parts are in each case provided with the same reference symbols. The elements illustrated should not be regarded as true to scale; rather, individual elements may be illustrated with an exaggerated size in order to afford a better understanding.

Figure 1A:
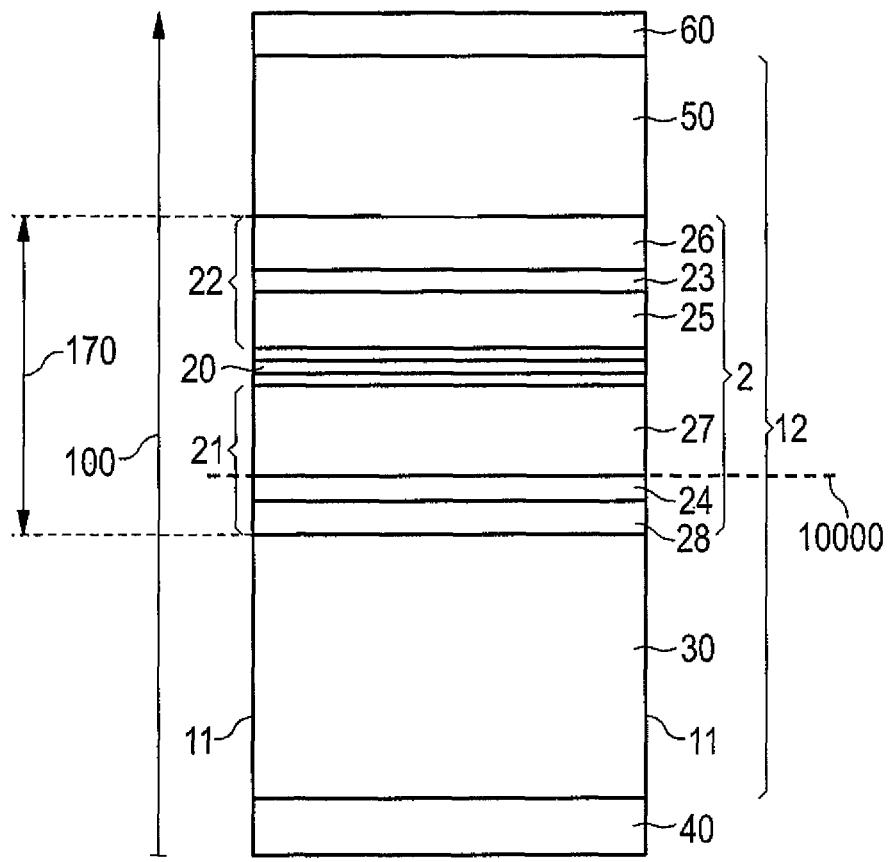
FIGS. 1A and 5 show, in schematic views, exemplary embodiments of an edge emitting semiconductor laser described here.

FIG. 1A shows, on the basis of a schematic sectional illustration, an edge emitting semiconductor laser 1 described here, comprising an n-doped growth substrate 40, along a grown direction 100. The growth substrate 40 is preferably formed with gallium nitride. A semiconductor layer sequence 12 is grown onto the growth substrate 40. The semiconductor layer sequence 12 comprises an n-doped layer 30, an overall waveguide region 2 and also a p-doped layer 50 applied to the overall waveguide region 2. Furthermore, a p-side contact 60 is applied to the semiconductor body 12 for making contact with the edge emitting semiconductor laser 1.

The overall waveguide region 2 is formed with an n-side waveguide region 21, a p-side waveguide region 22 and also an active zone 20 arranged between the n-side and p-side waveguide regions 21 and 22. Preferably, the n-side waveguide region has a thickness of 150 to 750 nm, in the present case of 600 nm, wherein the n-side waveguide region is formed by a reflection layer 24 and also semiconductor layers 27 and 28 directly adjoining the reflection layer 24. The semiconductor layers 27 and 28 are separated from one another by the reflection layer 24, wherein the semiconductor layer 27 directly adjoins the active zone 20. In this connection, it is conceivable for the overall waveguide region 2 to be formed by a multiplicity of further layers in different combinations. Both the reflection layer 24 and the layers 27, 28 and 30 are doped with an n-type dopant, for example silicon impurity atoms. The refection layer 24 is based on AlGaN, wherein the aluminium concentration preferably ranges between 1.5% and 15%. On account of the aluminium contained in the reflection layer 24, the refractive index of the reflection layer 24 is less than the refractive index of the layer 28 and/or of the layer 27. A refractive index jump $\Delta n$ is formed at an interface 10000 as a result of the difference in refractive index.

In the same way as the n-side waveguide region 21, the p-side waveguide region is based on InGaN, wherein, for p-type doping, a metallic material, for example magnesium, is introduced into the p-side waveguide region 22. Furthermore, the thickness of the p-side waveguide region 22 is 100 nm to 400 nm, in the present case 250 nm. The p—side waveguide region 22 has a p-doped electron blocking layer 23, which is formed with AlGaN. Between the active zone 20 and the electron blocking layer 23, an undoped spacer layer 25 is arranged in the p-side waveguide region 22. In this connection, "undoped" means that the externally introduced doping of the undoped spacer layer 25 is less than $5 \times 10^{17}$ 1/ccm. The undoped spacer layer 25 has a thickness of preferably 50 nm to 250 nm, in the present case of 100 nm.

In the present case, the active zone 20 is formed with InGaN. When electrical contact is made, the edge emitting semiconductor laser 1 emits, in particular, in a wavelength range of between 390 nm and 560 nm. Furthermore, the edge emitting semiconductor laser 1 has two facets 11, which extend in a vertical direction with respect to the epitaxially grown semiconductor layers of the semiconductor body 12 over the entire vertical extent of the semiconductor laser 1. In this case, "vertical" means perpendicular to the epitaxially grown semiconductor layer sequence. Via the facets 11, the electromagnetic radiation emitted by the active zone 20 is coupled out from the semiconductor laser 1.

Figure 1B:
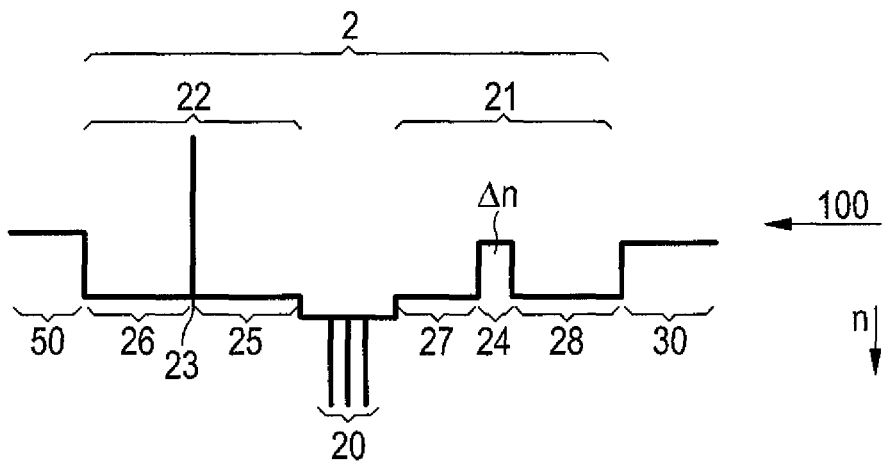

FIG. 1B schematically shows a refractive index profile n along the growth direction 100 of the edge emitting semiconductor laser 1 illustrated in FIG. 1A. The refractive index jump $\Delta n$ proceeding from the reflection layer 24 in the direction of the layer 27 can be discerned in the region of the n-side waveguide region 21. Furthermore, in the present case, both the reflection layer 24 and the layer 30 have the same refractive index. FIG. 1B likewise illustrates that the layers 26, 25, 27 and 28 have the same refractive index.

Figure 2:
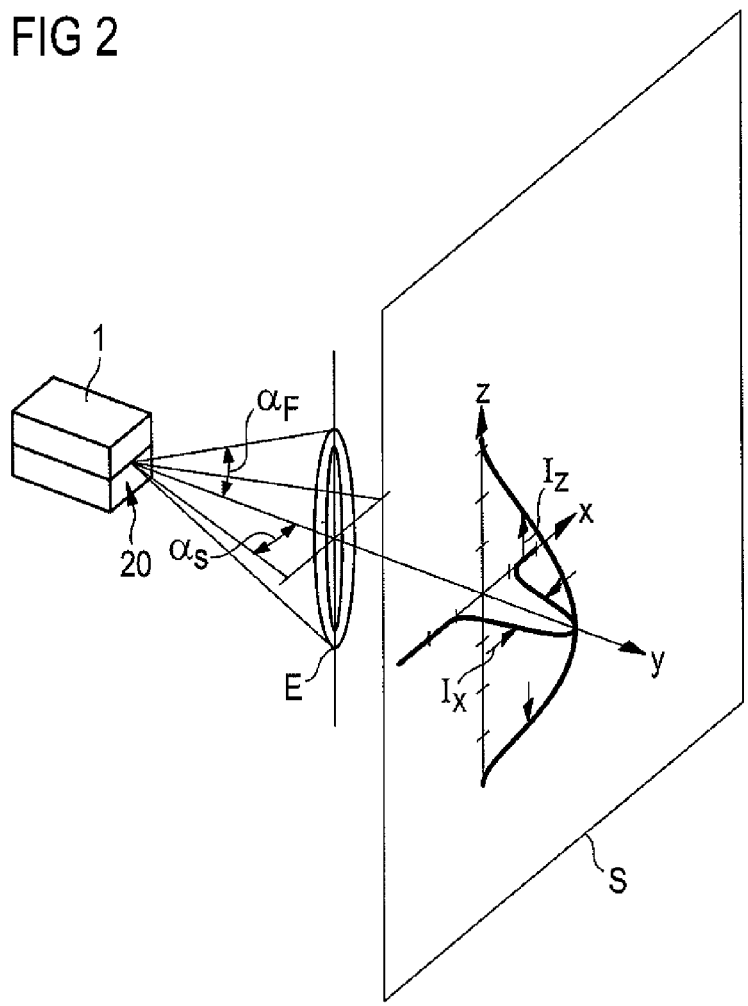

FIG. 2 illustrates an emission image E showing a spatial intensity distribution. For this purpose, the emission image E is projected for example onto a screen S into which a system of coordinates is integrated. The intensity distribution is plotted in this system of coordinates, wherein a y-axis runs parallel to the emission direction of the edge emitting semiconductor laser 1 and the z- and x-axes form a plane running perpendicular to the y-axis. In this connection, the z-axis is also designated as "fast axis" and the x-axis as "slow axis". It can be discerned that the intensity distribution both in the x-direction and in the z-direction in each case have their maximum at a common point on the y-axis. In other words, in the emission image E, the intensity diminishes in a direction away from the y-axis. In the present case, the intensity pattern in the z-direction $I_z$ and the intensity pattern in the x-direction $I_x$ are formed in Gaussian fashion.

If a connecting line is fictitiously drawn between the active zone 20 and the point of intersection between the intensity distribution $I_z$ and the z-axis, then a fast axis angle $\alpha_f$ is defined as the angle between such a fictitious connecting line and the y-axis. An analogous definition applies to the slow axis angle $\alpha_s$, which is likewise defined by the y-axis and the point of intersection between the intensity distribution $I_x$ and the x-axis. A ratio AR (denoting aspect ratio) is then given by the following relationship:

$$AR := \alpha_f / \alpha_s.$$

If the fast axis angle $\alpha_f$ is particularly large in comparison with the slow axis angle $\alpha_s$, then the emission image E appears elliptical. However, a low AR is important for a simple setting of the emission image or of the emission properties of the edge emitting semiconductor laser 1.

Figure 3A:
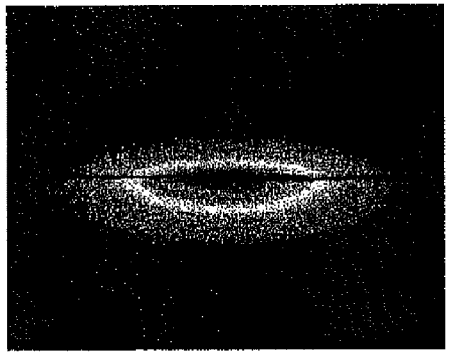
Figure 3B:
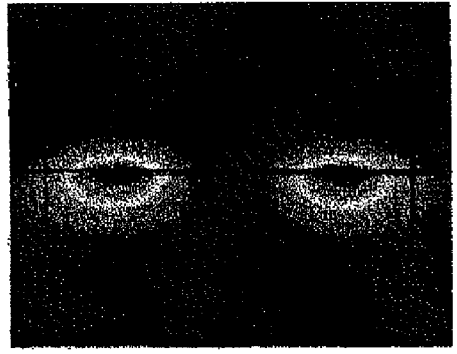

FIGS. 3A and 3B show such emission images in schematic illustrations. While FIG. 3A shows the emission image of the fundamental mode emitted by the active zone 20, FIG. 3B shows the next higher mode emitted by the active zone 20. Both modes are generated by the active zone 20 and guided out from the semiconductor laser.

Figure 4:
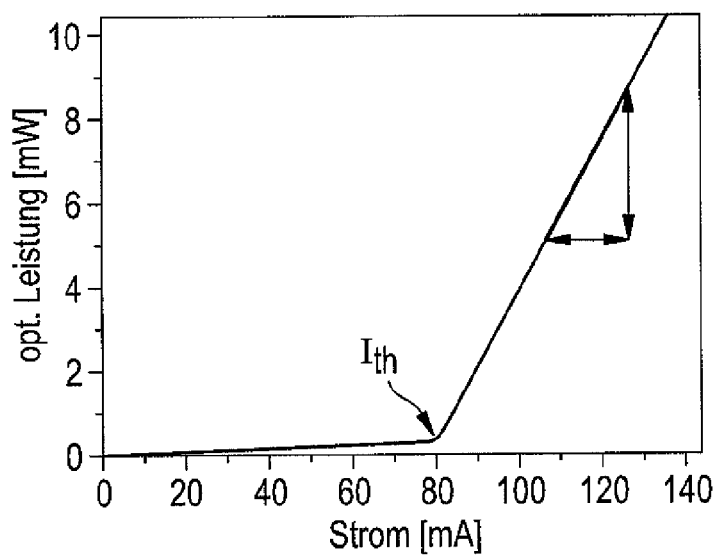

FIG. 4 shows a current-output power characteristic curve of a semiconductor laser, in which the individual optical output power values are plotted against the current feed level of the semiconductor laser. FIG. 4 illustrates that up to a value of approximately 80 mA the semiconductor laser 1 hardly emits electromagnetic radiation, while at a current intensity above that the semiconductor laser 1 "suddenly" begins to emit electromagnetic radiation. The current feed level starting from which the edge emitting semiconductor chip 1 begins to emit electromagnetic radiation is designated as a threshold current level $I_{th}$. In this connection, a slope efficiency Sh is defined as:

$$Sh := (\Delta \text{ of the optical output power})/(\Delta I).$$

Furthermore, a mode stability factor MSF shall be given by the relationship $$MSF := (I_{th} \text{ of the next higher mode})/(I_{th} \text{ of the fundamental mode}).$$

In other words, a high MSF is important for a fundamental-mode emission of the edge emitting semiconductor laser 1.

A as low as possible threshold current intensity $I_{th}$ is desirable particularly with regard to the beam quality and an as early as possible excitation of the fundamental mode.

Figure 5:
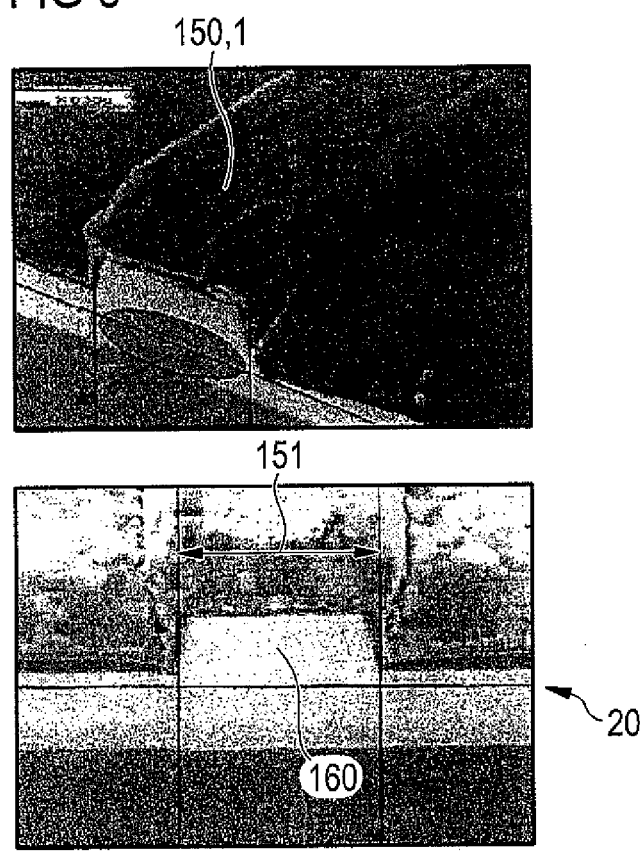

FIG. 5 shows such an edge emitting semiconductor laser 1. In the present case, the semiconductor laser 1 shown in FIG. 5 is a ridge laser comprising a ridge 150 illustrated in FIG. 5. The ridge laser has a ridge width 151, in this case the ridge width being the lateral extent of the semiconductor laser 1, that is to say parallel to the epitaxially grown semiconductor layer sequence. The facet 160 and also the active zone 20 can be discerned in the side views in FIG. 5.

Figure 6A:
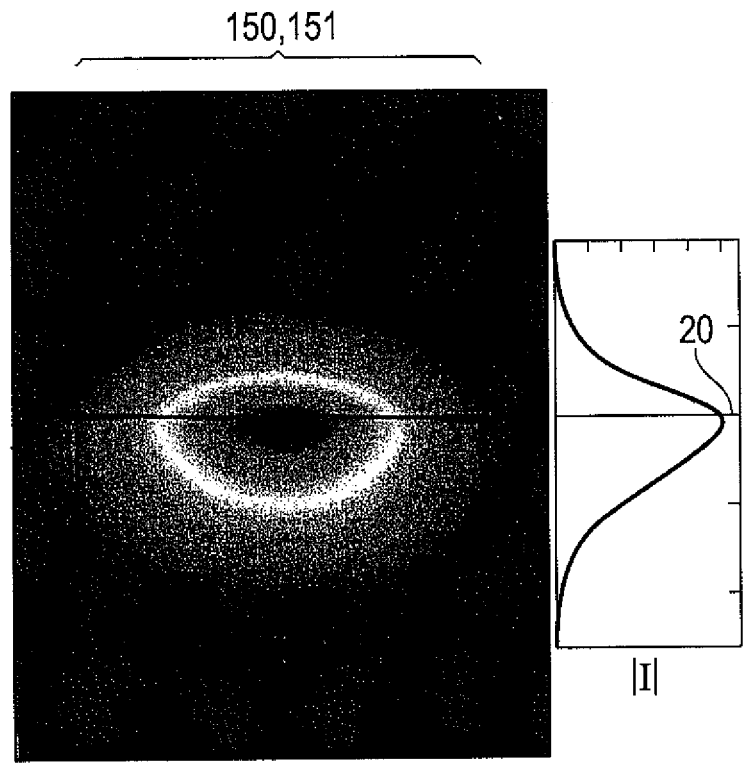

FIG. 6A shows, in a schematic illustration, the emission image E of the fundamental mode of the semiconductor laser 1 described here. The absolute value of the intensity distribution |I| has its maximum in the region of the active zone 20, wherein the intensity |I| of the electromagnetic radiation emitted by the active zone 20 decreases with greater distance from the active zone 20. Furthermore, it can readily be discerned from FIG. 6A that the fundamental mode is supported by the waveguide region 2 of the edge emitting semiconductor laser 1 and the fundamental mode has a well-defined intensity maximum in the region of the active zone 20.

Figure 6B:
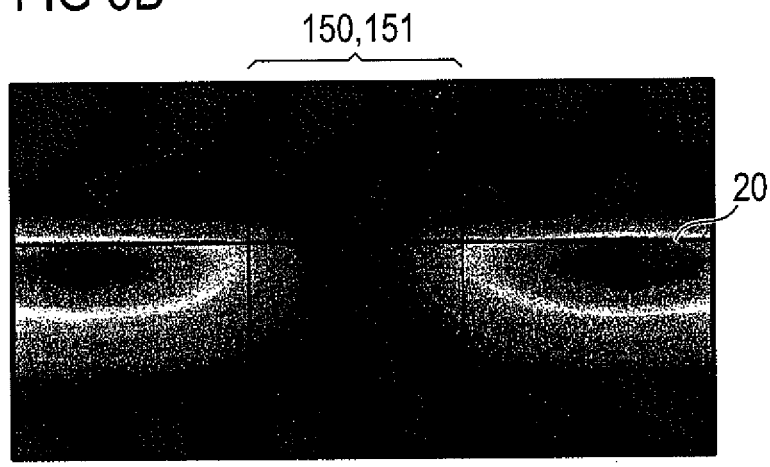

FIG. 6B shows the emission image E of the next higher mode. In contrast to FIG. 6A, it can be discerned here that the emission image E of the next higher mode has a "blur" and therefore does not have a concentric maximum in the intensity distribution. This is a clear indication that the edge emitting semiconductor chip 1 does not support the next higher mode.

Figure 7A:
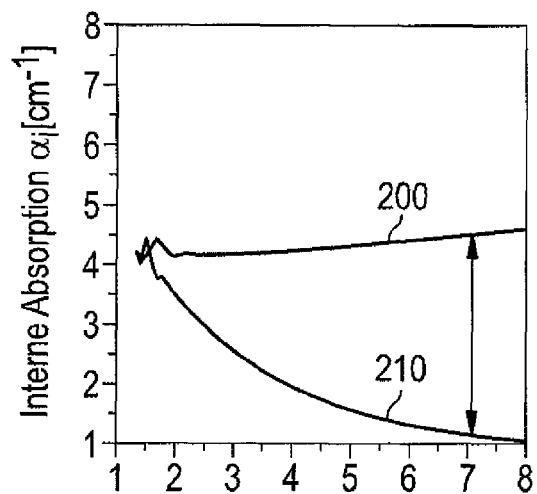
Figure 7B:
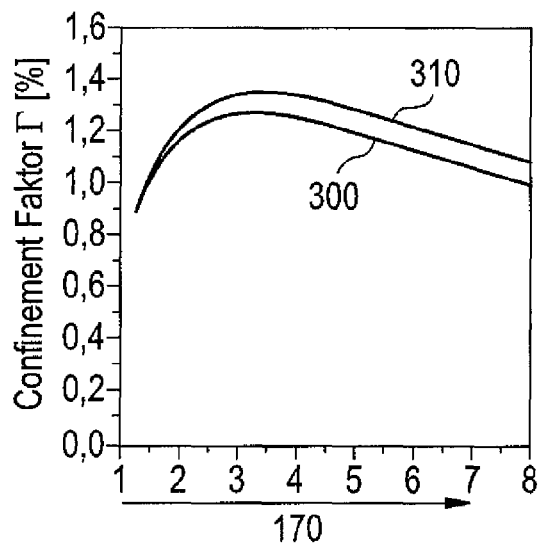
Figure 7C:
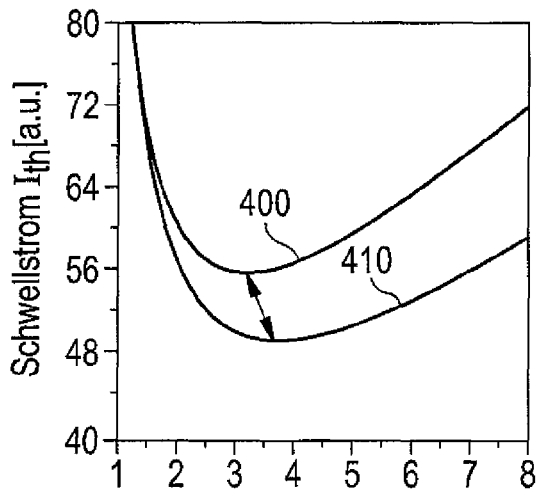

FIGS. 7A, 7B and 7C show physical measurement results as a function of a thickness 170 of the waveguide region 2. The curves 200, 300 and 400 in each case show the physical measurement results for an edge emitting semiconductor laser without the undoped spacer layer and reflection layer described here, while the curves 210, 310 and 410 in each case show the physical measurement results for an edge emitting semiconductor laser 1 described here.

In this respect, in FIG. 7A, the curve 210 shows an internal absorption $\alpha_i$ as a function of the overall waveguide region thickness 170.

It can be discerned that the internal absorption $\alpha_i$ in the case of an overall waveguide region thickness 170 of $(3 \cdot d_0)$ has already decreased almost by half the starting value starting in the region of a thickness of around $(1 \cdot d_0)$, where $d_0$ represents a unit length of 100 nm. In the case of an overall waveguide region thickness 170 of $(5 \cdot d_0)$, the internal absorption $\alpha_i$ is already only approximately one third of the starting value. Compared with the curve 200 of the absorption values $\alpha_i$ of a semiconductor laser without the reflection layer and the undoped spacer layer, the value in the case of an overall waveguide region thickness 170 of $(5 \cdot d_0)$ is merely just approximately one quarter. Although the layers 25 and 26 doped with magnesium in the waveguide region 2 increase the internal absorption, the increasing thickness 170 outweighs this undesired effect, such that ultimately an increasing overall waveguide region thickness 170 considerably reduces the internal absorption $\alpha_i$, as illustrated in FIG. 7A. It should supplementarily be noted that such a low internal absorption $\alpha_i$ is associated with a high slope efficiency Sh, which is desirable particularly for powerful semiconductor lasers.

FIG. 7B shows that a confinement factor $\Gamma$ of the edge emitting semiconductor laser 1 described here is increased in comparison with an edge emitting semiconductor laser without a reflection layer and undoped semiconductor layer and, therefore, the threshold current intensity $I_{th}$ shown in FIG. 7C simultaneously decreases.

Figure 8A:
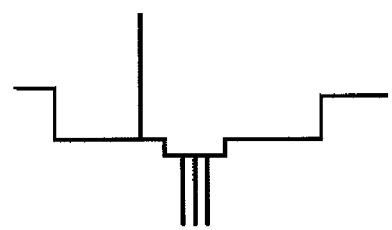
Figure 8B:
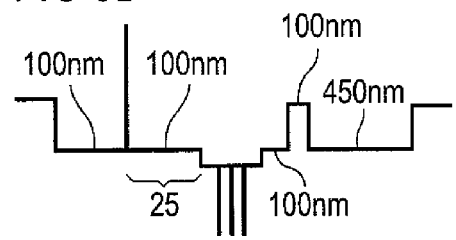
Figure 8C:
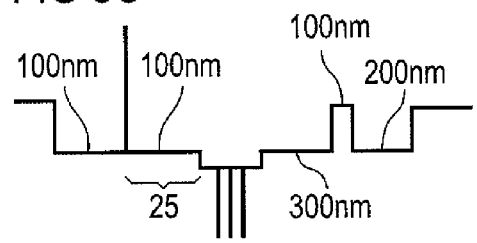
Figure 8D:
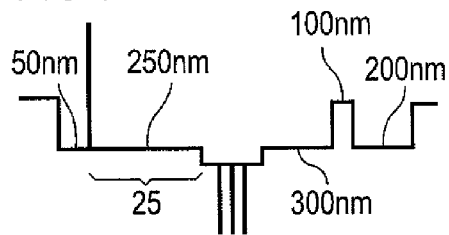

While FIG. 8A shows an exemplary embodiment of an edge emitting semiconductor laser without an undoped spacer layer and reflection layer, FIGS. 8B, 8C and 8D show exemplary embodiments of the edge emitting semiconductor layer 1 described here. In this case, the individual thickness indications of the individual layers of the semiconductor laser can be gathered from the corresponding FIGS. 8B, 8C and 8D.

The exemplary embodiment in accordance with FIG. 8A is designated below as reference structure 1111, the exemplary embodiments in accordance with FIGS. 8B, 8C and 8D being designated as structures 1000, 2000 and 3000.

Figure 9A:
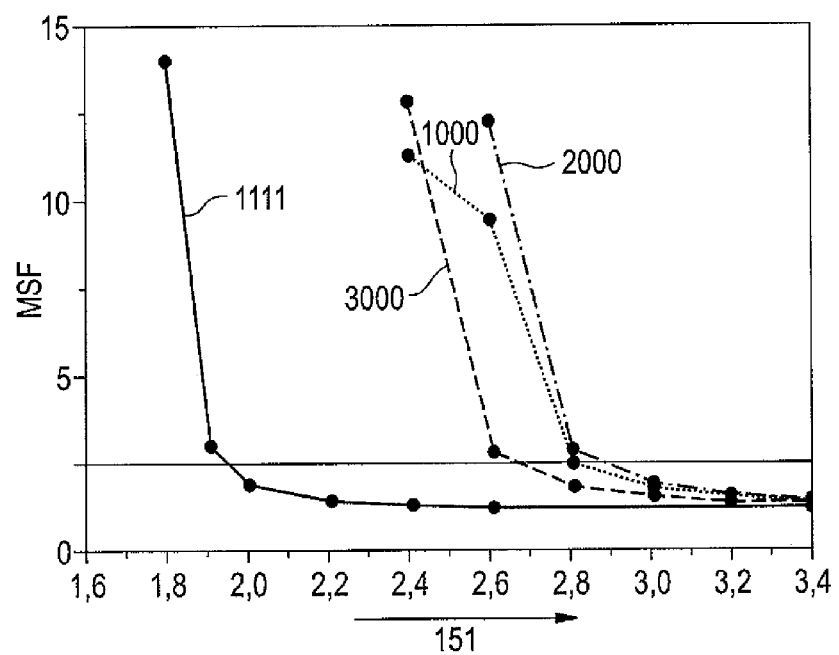

In FIG. 9A, the respective mode stability factors MSF of the structures illustrated in FIGS. 8A, SB, 8C and 8D are plotted against the ridge width 151. In this case, the ridge width 151 ranges between 1.6 μm and 3.4 μm. It can be discerned that the edge emitting semiconductor laser 1 in the form of the structure 2000 forms a laser having the highest MSF. By way of example, the MSF in the case of a ridge width of 2.7 μm of the structure 2000 is greater than the MSF of the structure 3000 by approximately a factor of 2.5. In other words, a fundamental-mode operation of the semiconductor laser 1 can best be realized by means of the structure 2000 since the higher modes are best suppressed by the layer thicknesses indicated in FIG. 8C. The structure 2000 therefore affords the highest beam quality of the structures shown here.

Figure 9B:
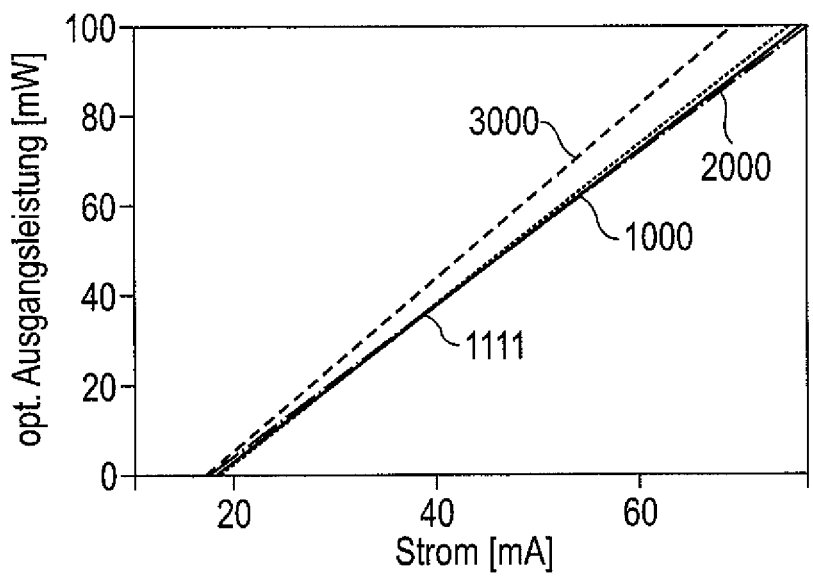

In FIG. 9B, the individual optical output powers of semiconductor lasers 1 described here in the form of the structures 1000, 2000 and 3000 are plotted against the external current feed level. It is evident from FIG. 9B that the structure 3000 forms a laser having the highest optical output power, while both the reference structure 1111 and the other two structures 1000 and 2000 have similar optical output power values.

Figure 9C:
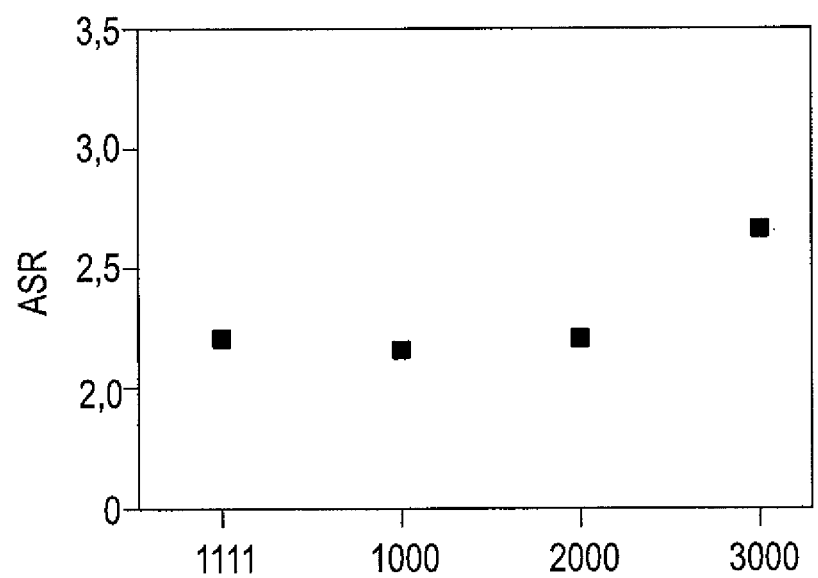

FIG. 9C shows the individual aspect ratios AR of the reference structure and of the structures 1000, 2000 and 3000. It can be discerned that the structure 1000 has the lowest aspect ratio, which is advantageous particularly for a simple setting of the emission image E.

To summarize it can be stated that the structure 1000 has the lowest aspect ratio ASR, the structure 2000 has the best beam quality and the structure 3000 has the highest optical output power. This is intended to demonstrate that, by means of an individual setting of the individual layer thicknesses of the waveguide region 2, laser parameters can be set to the respective individual requirements and areas of application of the edge emitting semiconductor laser 1. In this connection, it is conceivable for the layer thicknesses of the undoped spacer layer 25, of the reflection layer 24 and/or of further layers within the overall waveguide 2 to be coupled to the wavelength of the electromagnetic radiation that is emitted by the active zone 20.

FIG. 10 shows individual refractive index values n(x) of the reflection layer 24 as a function of an aluminium concentration in the reflection layer 24. In this case, the refractive index curves 4000, 5000 and 6000 show the refractive index profiles at wavelengths of 405 nm, 450 nm and 520 nm. In the case of an aluminium content of 0%, the curves 4000, 5000 and 6000 respectively have a refractive index of 2.512, 2.427 and 2.393. In this case, these refractive indices are respectively the refractive indices of the layers 27 and 28 directly adjoining the reflection layer 24. In the case of an aluminium concentration of 10%, by way of example, the curves 4000, 5000 and 6000 have a refractive index of approximately 2.43, 2.37 and 2.35. A refractive index jump Δn in the case of such an aluminium concentration then has the values respectively illustrated in FIG. 10. In the entire wavelength range of 390 nm to 560 nm emitted by the edge emitting semiconductor laser 1, the wavelength-dependent refractive index jump Δn preferably stays in a range of 0.015 to 0.2. In other words, the refractive index jump between the reflection layer 24 and the layers 27 and 28 adjoining the reflection layer can be individually adapted by means of the aluminium concentration x within the reflection layer 24. Furthermore, the aluminium concentration x in the reflection layer 24 is coordinated with the wavelength emitted by the active zone 20.

The invention described here is not restricted by the description on the basis of the exemplary embodiments. Rather, the invention encompasses any novel feature and also any combination of features, which in particular includes any combination of features in the patent claims. This holds true even if this feature or this combination itself is not explicitly specified in the patent claims or exemplary embodiments.

The invention claimed is:

1. An edge emitting semiconductor laser comprising:
    an n-side waveguide region and a p-side waveguide region;
    an active zone for generating electromagnetic radiation; and
    at least one reflection layer in the n-side waveguide region,
    wherein the active zone is arranged between the two waveguide regions, the thickness of the n-side waveguide region is greater than that of the p-side waveguide region, and
    wherein the refractive index of the reflection layer is less than the refractive index of the n-side waveguide region adjoining the reflection layer.

2. An edge emitting semiconductor laser comprising:
    an n-side waveguide region and a p-side waveguide region;
    an active zone for generating electromagnetic radiation;
    an electron blocking layer in the p-side waveguide region; and
    an undoped spacer layer in the p-side waveguide region,
    wherein the active zone is arranged between the two waveguide regions,
    wherein the thickness of the n-side waveguide region is greater than that of the p-side waveguide region, and
    wherein the undoped spacer layer is arranged between the active zone and the electron blocking layer.

3. The edge emitting semiconductor laser according to claim 1, wherein the p-side waveguide region has an electron blocking layer and also an undoped spacer layer, wherein the spacer layer is arranged between the active zone and the electron blocking layer.

4. The edge emitting semiconductor laser according to claim 2, wherein the n-side waveguide region has at least one reflection layer, wherein the refractive index of the reflection layer is less than the refractive index of the n-side waveguide region adjoining the reflection layer.

5. The edge emitting semiconductor laser according to claim 1, wherein the n-side waveguide region is at least 1.5 times thicker than the p-side waveguide region.

6. The edge emitting semiconductor laser according to claim 1,
    wherein the semiconductor material of the reflection layer is based on AlGaN and the semiconductor material of the n-side waveguide region adjoining the reflection layer is based on InGaN.

7. The edge emitting semiconductor laser according to claim 6, wherein the refractive index of the reflection layer in a wavelength range of 405 nm to 520 nm of the electromagnetic radiation emitted by the active zone differs by at least 0.02 from the refractive index of the n-side waveguide region adjoining the reflection layer.

8. The edge emitting semiconductor laser according to claim 1, wherein the reflection layer has a thickness of 15 nm to 150 nm and an aluminium concentration of 1.5% to 15%.

9. The edge emitting semiconductor laser according to claim 1, wherein the undoped spacer layer has a thickness of 50 nm to 250 nm.

10. The edge emitting semiconductor laser according to claim 1, wherein:
    the active zone emits electromagnetic radiation in the range of 390 nm to 560 nm;
    the n-side waveguide region has a thickness of 150 nm to 750 nm;
    the reflection layer has a thickness of 15 nm to 150 nm and also an aluminium concentration of 1.5% to 15%;
    the p-side waveguide region has a thickness of 100 nm to 400 nm;
    the undoped spacer layer has a thickness of 50 nm to 250 nm; and
    the n-side waveguide region, the p-side waveguide region and the undoped spacer layer in each case have an indium concentration of at most 10%.

11. An edge emitting semiconductor laser comprising:
    an n-side waveguide region and a p-side waveguide region;
    an active zone for generating electromagnetic radiation; and
    at least one reflection layer in the n-side waveguide region,
    wherein the active zone is arranged between the two waveguide regions,
    wherein the thickness of the n-side waveguide region is greater than that of the p-side waveguide region,
    wherein the refractive index of the reflection layer is less than the refractive index of the n-side waveguide region adjoining the reflection layer, and
    wherein the p-side waveguide region has an electron blocking layer and also an undoped spacer layer, wherein the spacer layer is arranged between the active zone and the electron blocking layer.

* * * * *